(12) United States Patent
Krivanek et al.

(10) Patent No.: US 8,373,137 B2
(45) Date of Patent: Feb. 12, 2013

(54) HIGH RESOLUTION ENERGY-SELECTING ELECTRON BEAM APPARATUS

(75) Inventors: Ondrej L. Krivanek, Sammamish, WA (US); Niklas Dellby, Lake Forest Park, WA (US)

(73) Assignee: Nion Co., Kirkland, WA (US)

( * ) Notice: Subject to any disclaimer, the term of this patent is extended or adjusted under 35 U.S.C. 154(b) by 40 days.

(21) Appl. No.: 12/924,320

(22) Filed: Sep. 24, 2010

(65) Prior Publication Data

US 2012/0074315 A1    Mar. 29, 2012

(51) Int. Cl.
*H01J 3/26* (2006.01)
(52) U.S. Cl. .............................. 250/396 R; 250/396 ML
(58) Field of Classification Search .............. 250/396 R, 250/396 ML
See application file for complete search history.

(56) References Cited

U.S. PATENT DOCUMENTS

| 6,184,524 | B1 * | 2/2001 | Brink et al. | 250/305 |
| 7,453,062 | B2 * | 11/2008 | Tromp | 250/305 |

* cited by examiner

*Primary Examiner* — Robert Kim
*Assistant Examiner* — Hanway Chang

(57) ABSTRACT

A high resolution energy-selecting electron beam apparatus and method for improving the energy resolution of electron-optical systems by restricting the energy range of admitted electrons, and optionally also for improving the spatial resolution by correcting chromatic and geometric aberrations. The apparatus comprises a plurality of magnetic or electrostatic prisms that disperse an electron beam according to the energies of the electrons into an energy spectrum, a plurality of magnifying lenses such as electromagnetic or electrostatic quadrupoles that increase the energy dispersion of the energy spectrum, an energy-selecting slit that selects a desirable range of energies of the electrons, and optionally also sextupole, octupole and higher-order lenses that correct chromatic and geometric aberration of the electron-optical system. The apparatus also comprises further magnetic or electrostatic prisms and electron lenses arranged such that the energy dispersion of the electron beam emerging from the apparatus is cancelled.

17 Claims, 5 Drawing Sheets

HIGH RESOLUTION ENERGY-SELECTING ELECTRON BEAM APPARATUS

BACKGROUND OF THE INVENTION

1. Field of the Invention

The invention relates to electron-optical systems such as electron microscopes and microanalyzers. It relates particularly to high resolution scanning electron microscopes, high resolution scanning transmission electron microscopes, and to high resolution fixed-beam transmission electron microscopes.

2. Description of Prior Art

Electron-optical systems able to form electron beams that are narrow in spatial extent and also narrow in their energy spread are able to probe matter on an atomic scale, and are able to provide valuable information about the structure of matter, its chemical composition, chemical bonding, and electronic and vibrational properties. Information about chemical composition and bonding, and the electronic and vibrational properties of matter is typically derived from electron energy loss spectra, formed by passing a monochromatic beam of electrons through a thin sample in which the beam suffers discrete energy losses, dispersing the beam in energy, and recording a spectrum of the losses. The spatial resolution of such studies is largely determined by the brightness of the electron source and by the aberrations of the electron-optical system that forms the electron probe. The energy resolution of the spectrum is largely determined by the energy width of the electron beam incident on the sample, and by the energy resolution of the spectrometer.

The spatial resolution determines the size of the smallest sample features that may be imaged and analyzed, and atomic resolution becomes possible if the electron probe is smaller than one atom. The energy resolution of the recorded energy-loss spectrum determines what kinds of information may be obtained from it. Chemical composition information may be obtained from spectra showing an energy resolution of a few eV, chemical bonding and electronic properties typically require spectra with energy resolution of a few tenths of eV, and the sample vibrational properties may be probed by spectra with an energy resolution of a few meV. Because more information becomes available at higher resolution, there is much interest in improving the ability of electron-optical systems to focus electron beams into very narrow probes, and to form energy loss spectra with very high energy resolution.

Recent introduction of correctors of geometric aberrations has allowed the spatial extent of electron beams of medium primary energies of around 100 keV to be made smaller than the diameter of a hydrogen atom (i.e., <1 Å). Cold field emission electron guns are able to produce electron beams as narrow in energy as 0.25 eV, and electron monochromators are able to produce beams of electrons with primary energy of 100-200 keV that are as narrow as 30 meV and therefore can potentially lead to 30 meV energy resolution in electron energy loss spectra. However, no electron beam apparatus has yet been able to produce an electron beam of atomic size (1 Å diameter) at a primary beam energy of less than 50 keV, nor to illuminate a sample with an atom-sized electron beam and at the same time to resolve features in electron energy loss that are separated by less than 30 meV.

Being able to produce atomic-sized probes at the lowered primary energies would be advantageous when exploring materials made from light atoms, in which a lower primary energy often results in a dramatic reduction of knock-on radiation damage. Being able to produce electron energy loss spectra with an energy resolution better than 30 meV and preferably just 1-5 meV would allow an exploration of vibrational spectra of materials, and in this way provide a particularly rich new source of information.

The principal limit on the spatial resolution in electron beam systems corrected for geometric aberrations comes from chromatic aberration. There are two principal ways how the chromatic limit may be improved. In the first way, the energy spread of the beam is decreased through the use of an optical system that disperses the electrons according to their energies, and then intercepts, typically using an energy-selecting slit, all electrons whose energies lie outside a given pass-band of energies. Such an apparatus is typically called an electron monochromator. The resultant beam of narrower energy width is then affected by the chromatic aberration of the optical system much less, and an improvement in spatial resolution is typically obtained. The monochromator also significantly improves the attainable resolution in electron energy loss spectra. However, the improvement comes at the cost of a decreased brightness of the electron beam, caused by a large part of the beam being stopped by the energy-selecting slit. In the second way, the chromatic aberration of the optical system is corrected by a corrector of chromatic aberration. The chromatic aberration corrector does not filter out any electrons and therefore preserves the brightness of the electron beam, but it cannot improve the energy resolution of electron spectra.

Many types of both electron monochromators and chromatic aberration correctors have been developed over the years, as described for instance in U.S. Pat. Nos. 5,838,004, 6,407,384 B1, 6,580,073 B2 and 6,770,878 B2. Because chromatic aberration and a lack of a sufficiently bright electron beam are the two main factors that determine the spatial resolution when operating at lowered primary energies of the order of 20-60 kV, the chromatic correction is especially suitable for this type of operation.

A useful measure of the quality of a monochromator is the order of aberrations that it is able to correct. All monochromators are able to focus electron beams as needed to first order and some are also able to do second-order focusing, but no monochromator has yet achieved full third order focusing by correcting all important third-order aberrations. The higher the order of focusing a monochromator is able to do, the greater the range of angles of the electron beam it is able to monochromate correctly. Increasing the acceptable range of angles allows beams of greater total electron current to be monochromated. The interception of electrons of unwanted energies by the monochromator's energy-selecting slit results in a significant loss of total beam current, and being able to monochromate electron beams of larger starting current is therefore a significant advantage.

Another useful distinction is that existing monochromator designs can be separated into two broad classes: monochromators that disperse the electron beam according to energy and send the dispersed beam back into the overall electron-optical apparatus without nulling the dispersion, and monochromators that disperse the beam in order to do the energy selection, and subsequently null the dispersion before re-inserting the beam into the rest of the electron-optical apparatus. The second class is often called dispersing-undispersing monochromators. The first class of monochromators is simpler to build, but suffers from the disadvantage that the uncancelled energy dispersion causes a significant broadening of the virtual source of electrons, and hence a significant loss of brightness of the incident electron beam even when the energy-selecting slit is wide open, and no energy selection is taking place.

Monochromators developed up to the present time have typically acted on an electron beam of a low energy of the order of a few hundred eV to a few keV. This increases the energy dispersion the monochromators are able to achieve, and in this way allows the selection of narrower pass-bands of energies. The electrons are typically accelerated up to their final energy only after the energy selection has been accomplished. Unfortunately, performing the energy selection on particle beams of low energy increases the importance of Coulomb interactions between the individual electrons that constitute the electron beam. This interaction then limits the ultimate spatial and energy resolution that can be attained by the apparatus. Another limitation of monochromators performing the energy selection on a low energy beam is that variations in the high voltage used for the final acceleration cannot be readily compensated in the spectrometer part of the total apparatus, unless the electron beam is decelerated before the spectrometer, which is impractical and costly, and leads to further Coulomb interactions. Most spectrometers currently in existence therefore do not decelerate the electron beam before the spectrometer, with the result that instabilities in the accelerating voltage show up as instabilities in the energy of the final energy spectrum formed by a total apparatus comprising an electron spectrometer in addition to the electron source and the monochromator.

A monochromator system described in U.S. Pat. No. 5,097,126 was designed to perform energy selection on electrons of the full primary energy, in order to decrease the deleterious effect of Coulomb interaction. Because it operated on electrons of the full primary energy, it was able to link the energy being selected by the monochromator to the energy being analyzed by a spectrometer situated downstream in the optical system, simply by running the same current in the windings of all the magnetic prisms used in the monochromator and the spectrometer that were connected in series. This should have been able to give a very useful improvement in the energy stability and the energy resolution of the total optical system. Unfortunately, this monochromator was of the type that does not cancel dispersion before re-inserting the beam back into the electron-optical column, and the maximum attainable brightness of the electron beam monochromated by it was there therefore much more limited than in a dispersing-undispersing design. Further, the monochromator was only able to do a partial correction of second order aberrations, and provided no correction of third order aberrations, and no chromatic correction. For all these reasons, the intensity of the monochromated electron beam produced by this monochromator would have been very weak if the energy-selecting slit were closed down as necessary for an energy resolution of a few meV, rendering the monochromator unsuitable for this application.

Correctors of chromatic aberration of electron-optical systems have traditionally employed crossed electrostatic and electromagnetic fields in electrostatic/electromagnetic quadrupoles or Wien filters, as for instance described in U.S. Pat. Nos. 4,962,313 and 6,797,962 B1. The electrostatic elements create difficulties due to their need for relatively high voltage (several kV) to be supplied to small electrodes held in vacuum, which often leads to discharges. Another problem that arises with this type of chromatic aberration correctors is that voltage stabilies of the order of 1 part in $10^8$ need to be achieved if an improvement in the spatial resolution is to be reached in modern, highly-perfected electron-optical systems, and such stabilities are difficult to attain and hold for an extended period of time.

Most users of electron microscopes and microanalyzers would find significant advantage in a energy-selecting apparatus and method acting on electrons of the full primary energy and therefore able to link the energy being selected by the apparatus to the energy being analyzed by a spectrometer, and which also performed correction of geometric and chromatic aberrations. They would especially appreciate it if the chromatic correction was performed electromagnetically, and thus avoided the need to bring large voltages inside the vacuum of the energy-selecting apparatus. They would also appreciate an energy-selecting apparatus able to cancel the energy dispersion before reinserting the electron beam into the column, which was therefore better able to preserve the brightness and intensity of the electron beam. They would further very much appreciate an ability to form electron energy spectra with an energy resolution sufficient for studying the vibrational modes of materials, at the same time as producing an electron probe of atomic dimensions, so that the vibrational properties could be explored on an atomic scale.

OBJECTS AND ADVANTAGES

Accordingly, several of the objects and advantages of the present invention are as follows: providing an apparatus and a method which act on an electron beam of a full energy of about 10 keV to 300 keV in such a way that enough energy dispersion is available to make possible restricting the energy width of the beam to less than 30 meV and ideally less than 10 meV without resorting to deceleration, and which allow linking to an energy loss spectrometer in such a way that variations in the energy of the electron beam entering the apparatus do not produce any shift of electron energy-loss spectra. Further objects and advantages of the invention are to correct aberrations including chromatic aberrations and third-order geometric aberrations, without resorting to the use of electrostatic optical elements requiring high voltages, and to cancel the energy dispersion that was used to separate and select electrons according to their energy, before re-inserting the electron beam into the rest of the electron-optical apparatus.

Readers will find further objects and advantages of the invention from a consideration of the ensuing description and of the accompanying figures.

DRAWING REFERENCE NUMERALS

Figure 1:
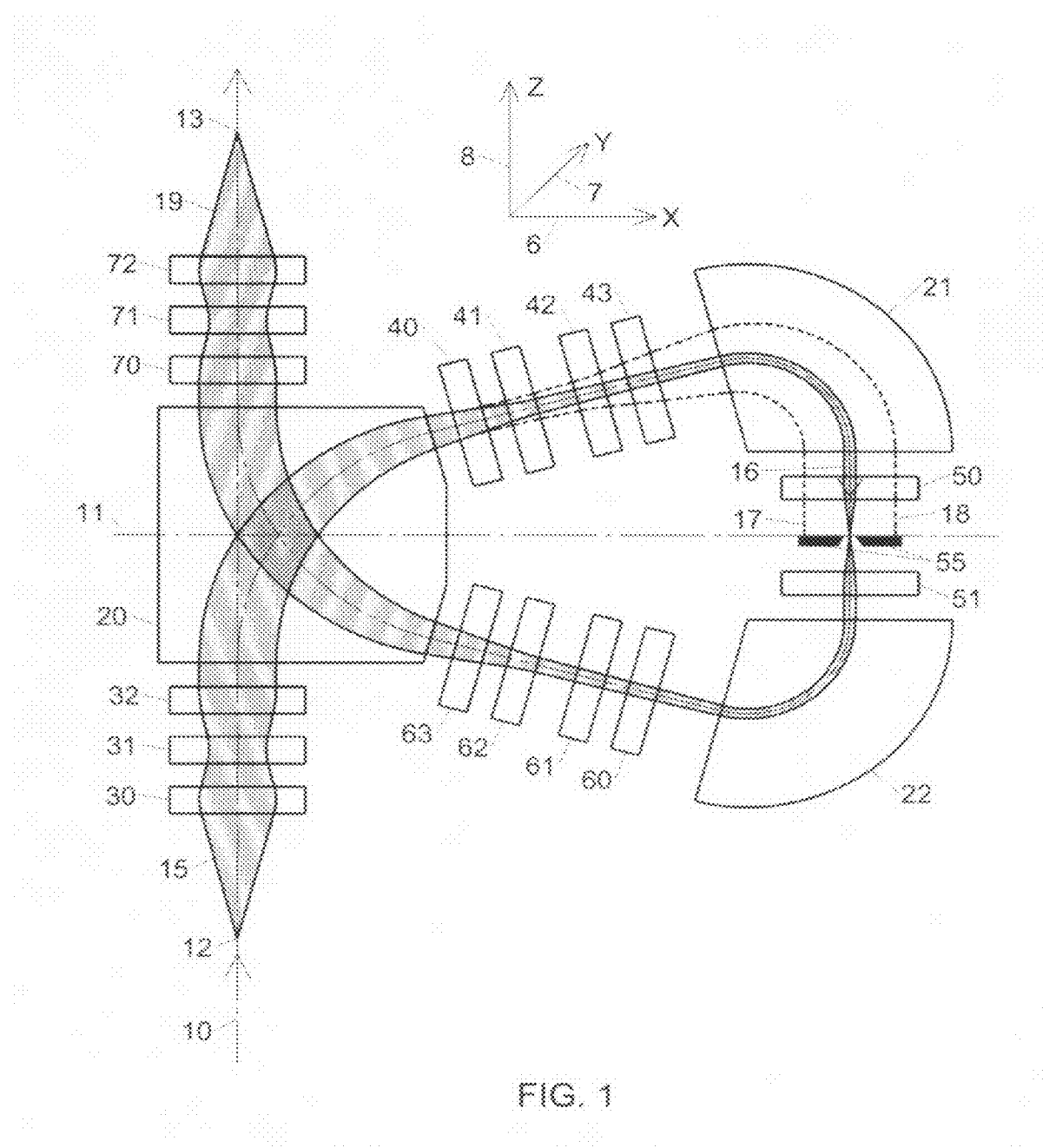
FIG. 1 is a schematic view of an energy-selecting apparatus of the present invention utilizing an alpha-type electron trajectory, and of the preferred electron trajectories through the energy-selecting apparatus in the X-Z plane.

6 X-axis
7 Y-axis

8 Z-axis
10 overall optic axis
11 apparatus midplane
12 entrance crossover
13 exit crossover
14 X-Z plane crossover
15 incoming electron beam
16 central energy ray
17 deviating energy ray
18 deviating energy ray
19 outgoing electron beam
20 electron prism
21 electron prism
22 electron prism
25 electron prism
26 Y crossover
27 Y crossover
28 Y crossover
29 Y-Z ray parallel to central energy ray
30 multipole lens
31 multipole lens
32 multipole lens
40 multipole lens
41 multipole lens
42 multipole lens
43 multipole lens
50 multipole lens
51 multipole lens
55 energy-selecting slit
60 multipole lens
61 multipole lens
62 multipole lens
63 multipole lens
70 multipole lens
71 multipole lens
72 multipole lens
80 sextupole lens turned off
81 sextupole lens turned on
90 electron sub-beam
91 electron sub-beam
92 electron sub-beam
93 beam crossover
94 beam crossover
95 beam crossover
96 beam crossover
97 beam crossover
98 beam crossover
100 optic axis
101 focal plane
102 focal plane
110 electron source
115 energy-selecting apparatus
120 condenser lens assembly
121 condenser lens assembly
122 aberration corrector
125 objective lens
126 projector lens assembly
127 beam-defining aperture
128 beam-defining aperture
130 sample
135 electron spectrometer
136 prism
140 detector

DESCRIPTION

Referring now to FIG. 1, an energy-selecting apparatus for use in an electron microscope is illustrated schematically. Microscopes for which the energy-selecting apparatus is suitable include scanning electron microscopes, scanning transmission electron microscopes and conventional (fixed beam) transmission electron microscopes. The energy-selecting apparatus is of the so-called alpha-type, named according to the shape of the electron trajectory through the apparatus, which resembles the Greek letter α.

The insert in FIG. 1 shows the coordinate system used. Z-axis 8 is made to point along the average direction of electron travel, and curves around to follow the beam when the beam is deflected. X-axis 6 lies in the plane of the paper, which is also a vertical mirror-symmetry plane of the apparatus, and it is always perpendicular to the Z-axis. Y-axis 7 is normal to the plane of the paper. Incoming electron beam 15 enters the energy-selecting apparatus generally in the direction of the overall optic axis 10 of the entire instrument, and it appears to emanate from entrance crossover 12, which can be either real or virtual. Incoming electron beam 15 traverses multipole lenses 30, 31 and 32, which allow the first order, second order and optionally also third and higher order pre-focusing to be adjusted as needed for producing suitable electron trajectories through the rest of the energy-selecting apparatus. 12-pole lenses, either electromagnetic or electrostatic, with one power supply per pole, allowing an arbitrary combination of dipoles, quadrupoles, sextupoles, octupoles, decapoles and dodecapoles to be produced, by energizing the separate poles as needed, are especially suitable for the multipoles. Alternately, for magnetic multipoles, separate windings can be provided for the dipole, quadrupole, sextupole, octupole, and higher-multiplicity fields, the windings connected in series with appropriate polarities, and one power supply provided for each separate set of interconnected windings, allowing direct control of the different multipole fields. Because the beam traversing multipoles 30 to 32 is not dispersed in energy, these multipoles are only able to adjust geometric aberrations, as opposed to chromatic aberrations. Additional multipoles may be added between entrance crossover 12 and prism 20 for more complete aberration correction, or some or all of the multipoles 30 to 31 may be omitted, and the needed corrections carried out after prism 20.

The pre-focused beam 15 next enters prism 20, in which it is bent away from overall optic axis 10 and also dispersed in energy. Magnetic prisms or electrostatic prisms are both suitable for this application. The energy dispersion of the beam at the exit of the prism, where it is travelling at around 60°-90° to the optic axis 10, depends on the precise trajectories chosen, and is of the order of $d = r \Delta E/(2E_o)$, i.e. about 0.5 μM for an energy deviation $\Delta E = 1$ eV, bending radius r of 10 cm, and primary energy $E_o = 100$ keV. The dispersion is shown schematically by separating the incoming beam 15 into a central energy trajectory 16 and deviating energy trajectories 17 and 18.

Energy dispersion of 0.5 μm per eV is too low for a passband of energies only a few meV wide to be selected by an energy-selecting slit. To attain 2 meV energy width, the opening in the slit would need to be just 1 nm wide, i.e. about 5 atoms across. Such a slit cannot be made with sufficient accuracy and even if it could be made, contamination of a few atomic monolayers would completely seal it off. The present invention therefore magnifies the energy dispersion, and in this way allows physically realizable slits to be used. The magnification is performed by multipole lenses 40, 41, 42 and 43, which are 12 pole multipoles in the preferred embodiment, similar to multipole lenses 30 to 32. The multipole component which creates the magnification is the quadrupole one, which is able to adjust the first-order trajectories through the apparatus. The four post-prism quadrupole-containing multipoles shown in FIG. 1 are typically able to achieve a magnification of the dispersion from 0× to about 1000×, giving an attainable range of dispersions from 0 to 500 μm per eV. Additional multipoles may be added between prisms 20 and 21 for even more magnification of the dispersion. The sextupole moments of the multipoles serve to tune second-order aberrations, the octupole components serve to tune the third order aberrations, and higher-multiplicity components serve to tune higher-order aberrations. Because the electron beam traversing multipoles 40 to 43 beam is dispersed in energy, the variable multipole components are able to change mixed chromatic-geometric aberrations. In particular, the sextupole components are able to change chromatic focus, also known as chromatic aberration. They are also able to change second-order geometric aberrations of interest at slit 55 known as $d^2x/dx'^2$ and $d^2x/dy'^2$, using a notation system in which $d^2x$ denotes the second order deviation of a ray at the slit in the X direction, and $x'=dx/dz$ and $y'=dy/dz$ denote the slope of a ray that as it is emerging from the entrance crossover 12. Octupoles are able to change third-order geometric aberrations of interest at slit 55 known as $d^3x/dx'^3$ and $d^3x/dx'dy'^2$.

Many different optical trajectories through magnifying multipoles 40, 41, 42 and 43 that give the needed range of magnifications are potentially available. The preferred arrangement is depicted schematically in FIG. 1. In this arrangement, in the X-Z plane, entrance crossover 12 is imaged with large magnification in the X direction in the plane of slit 55. There is no other X-Z plane beam crossover between entrance crossover 12 and slit 55, and magnifying multipoles 40, 41, 42 and 43 all act on virtual images of entrance crossover 12 rather than a real image of the crossover. The magnification results in deviating energy rays 17 and 18 becoming well separated from central energy ray 16 as they emerge from multipole 43, and the separation being preserved all the way to energy-selecting slit 55. Other trajectory regimes with one, two etc. additional crossovers in the X-Z plane between crossover 12 and slit 55 are also possible, but they are typically more difficult to set up, and give lower overall dispersions for comparable multipole excitations.

The electron beam next enters prism 21, in which it is bent around so that it ends up traveling at about 180° to the direction it entered the energy-selecting apparatus in. The prism can be magnetic or electrostatic. A gradient prism, in which the field weakens for electrons following larger diameter trajectories is the preferred embodiment, because it avoids too-strong focusing in the median plane of the prism. After traversing prism 21, the electron beam traverses multipole 50, in which the direction of electrons of energy-deviating paths 17 an 18 is fine-tuned to fulfill symmetry conditions needed for the total energy-selecting apparatus. The beam then impinges on energy-selecting slit 55, which admits a range of energies close to the energy of central energy ray 16, and intercepts all other energies.

An important characteristic of the energy-selecting apparatus is that it is completely or approximately mirror-symmetric about its midplane 11. The midplane passes through slit 55 and divides the energy-selecting apparatus into two mirror-symmetric halves. This means that each optical element up to the slit has a mirror-symmetric twin after the slit. The symmetry allows the energy dispersion created at slit 55 to be canceled after the slit, and outgoing electron beam 19 that emerges from the energy-selecting apparatus to be undispersed in energy, just like incoming beam 15 was. The mirror symmetric elements are multipole 51, prism 22, multipoles 60, 61, 62 and 63, prism 20, which is traversed a second time, and multipoles 70, 71 and 72. When there is a crossover of the electron trajectories at slit 55, the trajectories themselves are mirror-antisymmetric, because a ray deviating in the positive direction before slit 55 becomes a ray deviating in the negative direction after the slit. When a ray is parallel to but displaced sideways relative to central energy ray 16 at slit 55, the whole trajectory is mirror-symmetric, as a positive deviation in front of slit 55 remains a positive deviation after the slit.

The mirror symmetry imposes strict conditions on the electron trajectories at slit 55. Electron rays either have to go through a crossover, i.e. first-order focus, or be traveling parallel to the central energy ray 16 at the slit, in both X-Z and Y-Z planes. These conditions are fulfilled by adjusting the multipoles which precede the energy-selecting slit. The excitations of the multipoles are then replicated in their mirror-symmetric twins situated in the second half of the energy-selecting apparatus, for a set of complete electron trajectories that are either mirror-symmetric or mirror-antisymmetric about midplane 11 energy-selecting apparatus. The quadrupole components of the mirror-symmetric twin multipoles excited in the mirror-symmetric way gradually de-magnify the energy dispersion that was present at energy-selecting slit 55, eventually cancelling it altogether, so that beam 19 emerging from the energy-selecting apparatus has no energy dispersion. In practice, of course, slight differences due to machining and assembly errors, inhomogeneity of materials, etc., exist between the multipoles in the first half of the apparatus and the second half of the apparatus. These are usually handled by setting the real excitations of mirror-symmetric twin multipoles to be slightly different from each other, in such a way that it is the effects of the multipoles that are mirror-symmetric, with as good a precision as can be achieved experimentally. An even more practical way of handling the actual departures from exact symmetry is simply to cancel the aberration coefficients of interest at the exit of the energy-selecting apparatus, or even at the sample of the whole probe-forming column. This may lead to excitations of twin multipoles that are significantly different, and it can also be done when the exact mirror symmetry of the energy-selecting apparatus of the present invention is abandoned altogether.

Figure 2:
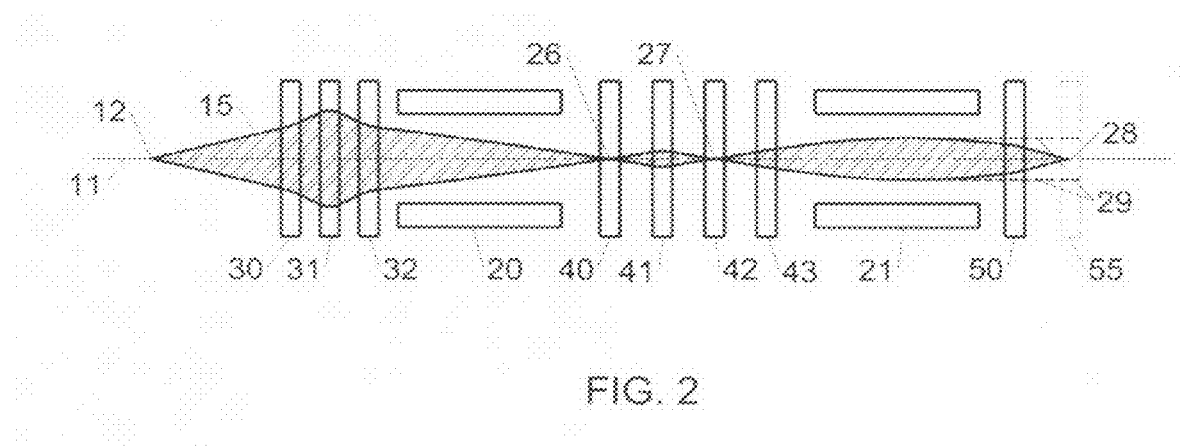
FIG. 2 is a schematic representation of the preferred first-order electron trajectories through the energy-selecting apparatus of FIG. 1 in the Y-Z plane.

FIG. 2 illustrates the optics of the energy-selecting apparatus by showing schematically the preferred arrangement of the first-order (Gaussian) electron trajectories of the energy-selecting apparatus in the Y-Z plane, i.e. in the direction perpendicular to the plane of FIG. 1. This plane curls over inside the prisms of the system, so as to follow the direction of the electron beam. The drawing shows only the first half of the apparatus, up to the slit. The post-slit half of the apparatus is mirror-symmetric with respect to the first half, as shown in FIG. 1, and it is not shown in FIG. 2. The electron trajectories through the second half in the Y-Z plane can be arranged either mirror-symmetrically or mirror-antisymmetrically with respect to the first half. Entrance crossover 12, which is an astigmatic crossover, is imaged in the Y-Z plane into two further crossovers 26 and 27, which are not stigmatic—the electron beam is not focused in the X direction at their locations. The preferred locations for the extra Y crossovers are near the center of multipole 40 and near the center of multipole 42, because this makes the quadrupole moments of multipoles 40 and 42 freely changeable, without the change affecting the Y-Z trajectories a great amount. Changing the quadrupole moment of multipoles 42 then makes it possible to change the X-Z plane magnification, i.e. the dispersion at slit 55, without changing the Y-Z plane trajectories, and changing the quadrupole moment of multipole 40 makes it possible to adjust the X focus of the energy-dispersed beam at slit 55, also without changing the trajectories in the Y-Z plane.

Many other optical solutions are potentially available with multipoles disposed as described above, but they typically do not result in as convenient set of settings as the one with Y crossovers at multipoles 40 and 42.

At energy-selecting slit 55, two different Y-Z trajectories that fulfill the needed symmetry conditions are possible. The preferred embodiment is a solution is in which there is a Y crossover at slit 55, as this decreases the mechanical precision with which slit 55 needs to be made. An alternate solution is to avoid focusing the electron beam at slit 55 in the Y-Z plane, but to make it parallel, i.e. neither converging nor diverging, instead. This solution also satisfies the needed mirror-symmetric condition for the entire energy-selecting apparatus. Changing the trajectories from the Y-Z focused solution to the parallel-beam one is readily accomplished by changing the excitations of multipoles 43 and 50, and/or changing the gradient angle of prism 21 and/or changing the physical distances between optical elements next to prism 21.

Figure 3:
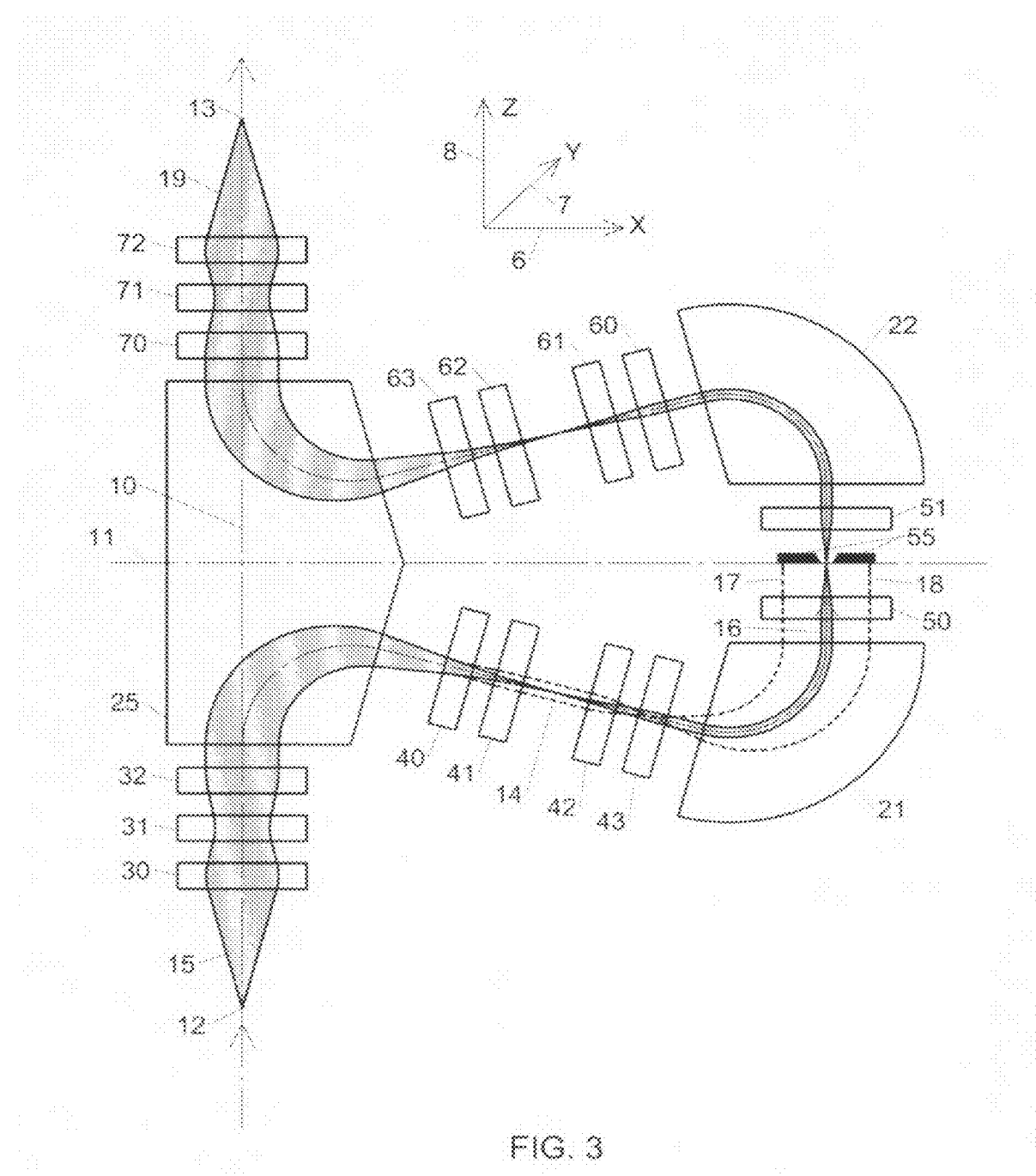
FIG. 3 is a schematic view of an energy-selecting apparatus of the present invention utilizing an omega-type electron trajectory, and of the preferred electron trajectories through the energy-selecting apparatus in the X-Z plane.

FIG. 3 illustrates another possible embodiment of the present invention, which uses an omega-type of electron optical solution instead of an alpha-type one. In the omega-type solution, the central energy ray 16 traces out the Greek letter $\Omega$, which means that the electron beam at energy-selecting slit 55 is traveling in the same general direction as the entrance beam 15, whereas in the alpha-type solution it was traveling anti-parallel to entrance beam 15. This change is accomplished by using a first prism 25 in which the bending angle is >90°, generally in the range of 110-135°. The rest of the energy-selecting apparatus can stay substantially the same as for the alpha-type solution, with multipole lenses 30, 31 and 32 situated in front of first prism 25, multipole lenses 40, 41, 42 and 43 situated between first prism 25 and second prism 21, multipole lens 50 situated between second prism 21 and energy-selecting slit 55, and the second half of the energy-selecting apparatus arranged mirror-symmetrically with respect to the first, pre-slit half. The preferred embodiment of the electron-optical trajectories through the $\Omega$-type energy-selecting apparatus uses essentially an identical arrangement in the Y-Z plane as the $\alpha$-type energy-selecting apparatus, but a slightly different arrangement in the X-Z plane, in which it has an extra crossover 14 in the X-Z plane, situated between prisms 25 and 21. This arrangement makes sure that higher-energy electrons take outside trajectories in both prism 25 and prism 21, which helps avoid a situation whereby the energy dispersion set up by prism 25 would be opposed by the dispersion due to prism 21. Similar to the $\alpha$-type energy-selecting apparatus, the $\Omega$-type energy-selecting apparatus can also employ a different number of multipole lenses in front of and behind prism 25 and in front of slit 55, without substantially deviating from the principles of adjustable magnification at slit 55 and a mirror-symmetric overall solution which undisperses the electron beam before it emerges from the apparatus.

Figure 4:
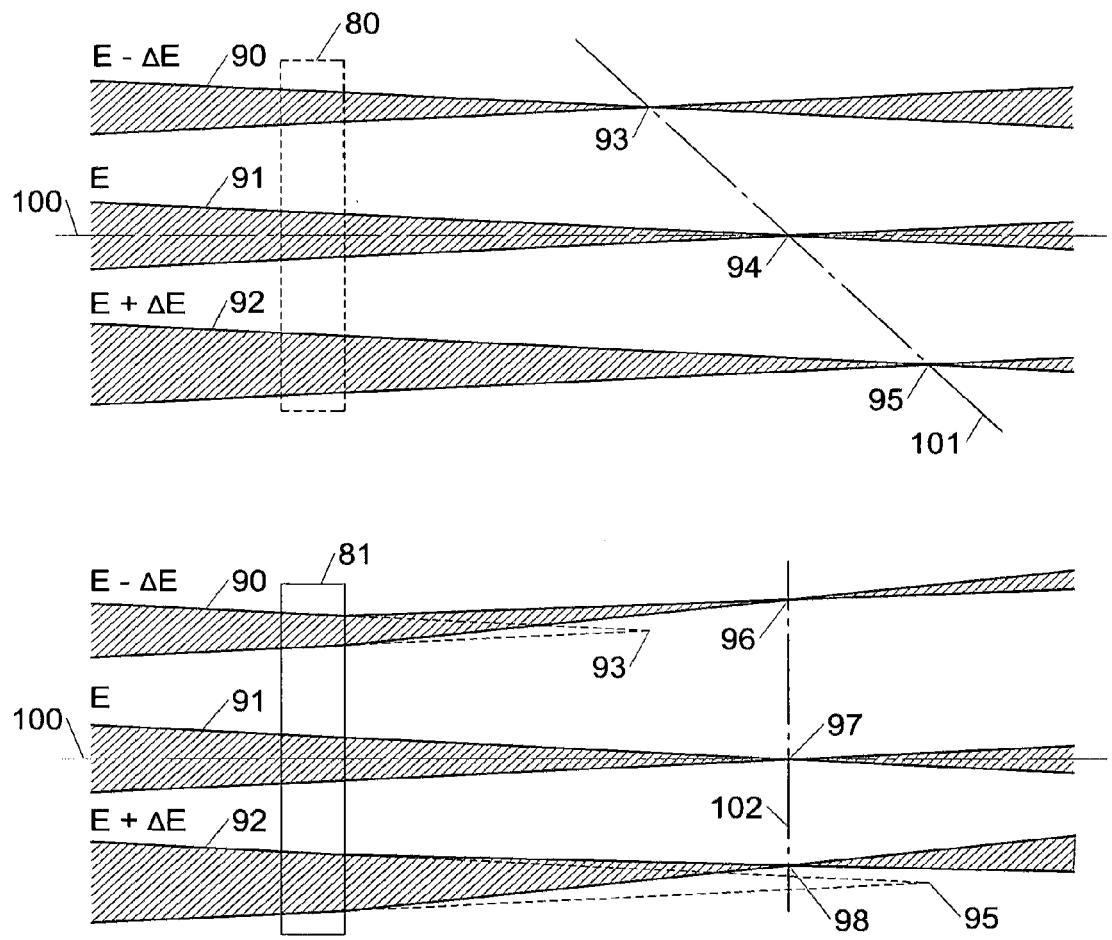
FIG. 4 is a schematic illustration of a sextupole employed for the correction of chromatic aberration.

FIG. 4 illustrates schematically how a sextupole optical element can be used for correcting chromatic aberration in an electron microscope comprising energy-dispersing elements. The top part of the figure shows schematically three electron sub-beams 90, 91 and 92 of different energies, E−$\Delta$E, E and E+$\Delta$E, respectively, coming to focus after traversing a sextupole 80 which has been turned off. The three sub-beams are focused into crossovers 93, 94, and 95, respectively. Due to chromatic aberration of the optical system preceding sextupole 80, the Z coordinate of the three crossovers is different, with the E-$\Delta$E crossover occurring at the lowest value of Z, and the E and E+$\Delta$E crossovers arising at higher values of the Z coordinate, i.e. further along in the optical apparatus. This results in focal plane 101, which is the plane that contains the crossovers formed by different energy electrons, being inclined to the optic axis 100 rather than normal to it.

The bottom part of FIG. 4 shows sextupole 81 that is turned on, and excited such that electron trajectories traversing it away from the sextupole axis are deflected in the X direction. A simple electromagnetic or electrostatic sextupole, or a sextupole component of an adjustable multipole are all suitable for this purpose. In a sextupole, the deflection of beams traveling not on the optic axis grows as the second power of the distance of the ray from the optic axis. A secondary effect of the deflection is that the points at which the different-energy sub-beams come to focus are displaced in the Z-direction, and result in displaced crossovers 96, 97 and 98. The focus shift is linear with the distance of the ray from the center of the sextupole and the strength of the sextupole. For an electron beam which is dispersed in energy, this results in adjustable focusing of electron of different energies, i.e. in adjustable chromatic aberration. The angle of the focal plane 102 becomes adjustable, and can be set so that the focal plane becomes normal to optic axis 100, which corresponds to one part of the chromatic aberration at slit 55 being corrected.

The adjustable focus shown schematically for the X-Z plane in FIG. 4 operates in a similar way for adjusting the chromatic focus in the Y-Z plane. Both the X-Z and Y-Z foci are preferably adjusted, so that stigmatic cancellation of chromatic aberration, i.e. the variation of focus with energy, is achieved no matter what is the azimuthal angle of the electron trajectory emerging from entrance crossover 12. The X-Z plane and Y-Z plane adjustment are easily separated by using sextupoles in locations where the first order properties of the electron beam are optimized for the adjustment in the X-Z and Y-Z plane. For the X-Z chromatic focus adjustment, the beam should ideally be dispersed in energy in the X-Z plane and also in the angle with which different rays emerged from entrance crossover 12 in the X-Z plane, i.e., it should not be focused in the X-Z plane inside the sextupole being used for the correction. For the Y-Z chromatic focus adjustment, the beam should ideally also be dispersed in energy in the X-Z plane but this time it should be dispersed in the angle with which different rays emerged from entrance crossover 12 in the Y-Z plane, i.e., it should not be focused in the Y-Z plane inside the sextupole being used for the correction. In the apparatus of the present invention using electron trajectories illustrated in FIGS. 1 and 2, the first condition occurs in multipole lens 40, in which the beam is dispersed in energy in the X direction, is not focused in X, and is focused in Y, as shown in FIGS. 1-3. The second condition occurs approximately in multipole lens 43, in which the beam is dispersed in energy in the X direction, is nearly focused in X, and is not focused in Y, as also shown in FIGS. 1-3. In a practical electron-optical system, nulling the chromatic aberration at slit 55 in the Y direction, i.e. the non-dispersion direction, is much less critical than nulling it in the dispersion direction, making they correction of the chromatic aberration at the slit somewhat optional.

Adjusting the sextupole components of multipole lenses 40 and 43 allows a complete chromatic aberration correction at slit 55, which manifests itself as zero tilt of the dispersion plane and zero chromatic astigmatism at the slit. The general constraint is that in order to make the chromatic defocus and chromatic astigmatism ($C_{c1,0}$ and $C_{c1,2}$, using the notation described for instance in an article by Krivanek et al. and published in the Handbook of Charged Particle Optics) adjustable and hence able to be set to zero as needed for chromatic aberration correction, variable-strength sextupoles need to act in two or more Z locations at which the beam is dispersed in energy and at which the ratios of the X and Y extents of the beam are different.

Adjusting the sextuple components of mirror-symmetric multipole lenses 60 and 63 also leads to adjustable chromatic aberration $C_{c1,0}$ and to adjustable chromatic astigmatism $C_{c1,2}$. The ability of the first half of the energy-selecting apparatus to set $C_{c1,0}$ and $C_{c1,2}$ to zero at the energy-selecting slit means that this part of the apparatus is able to compensate for chromatic aberrations introduced not just within the energy-selecting apparatus, but also in the electron source and the rest of the electron optics that precedes the energy-selecting apparatus. Positive chromatic aberration contributed by the electron-optical components situated between the energy-selecting apparatus and the sample, on which the electron beam needs to focused as accurately as possible, can be pre-compensated by exciting the sextuple components of mirror-symmetric multipole lenses 60 and 63 appropriately. In this way, the energy-selecting apparatus can serve as a chromatic aberration corrector for the pre-sample part of the optics of a scanning electron microscope (SEM) or a scanning transmission electron microscope (STEM). The same principles apply to an energy analyzer situated after the sample in a conventional, fixed-beam transmission electron microscope (CTEM), in which images are formed by lenses situated after the sample. Sextupoles acting on energy-dispersed rays of suitable first-order focus properties inside the energy analyzer can therefore correct the chromatic aberration of the transmitted image formed by the post-sample lenses of the CTEM.

In an analogous way, the higher-order components of multipoles situated inside the energy-selecting apparatus of the present invention may be used to correct higher order aberrations caused by the rest of the complete electron-optical system. Pre-slit multipoles 30, 31, 32, 40, 41, 42, 43 and 50 may be used to control aberrations at slit 55, thereby improving the precision of energy selection, and post-slit multipoles 51, 60, 61, 62, 63, 70, 71 and 72 may be used to control the aberrations of optical components situated between slit 55 and the sample in a complete SEM or STEM system, thereby improving the precision of the focusing of the electron beam at the sample. Sextupole components of the multipole lenses may be used in this way to adjust second-rank aberrations, which include second-order geometric aberrations and also mixed geometric-chromatic aberrations. Octupole components may be used to control third-rank geometric aberrations that include mixed geometric-chromatic aberrations. Aberrations which can be controlled in this way include axial coma $C_{2,1}$, 3-fold astigmatism $C_{2,3}$ and spherical aberration $C_{3,0}$, in addition to chromatic aberrations $C_{c1,0}$ and $C_{c1,2}$. In this way, the energy-selecting apparatus of the present invention may also perform the function of an aberration corrector for the probe, potentially replacing a stand-alone aberration corrector.

Figure 5:
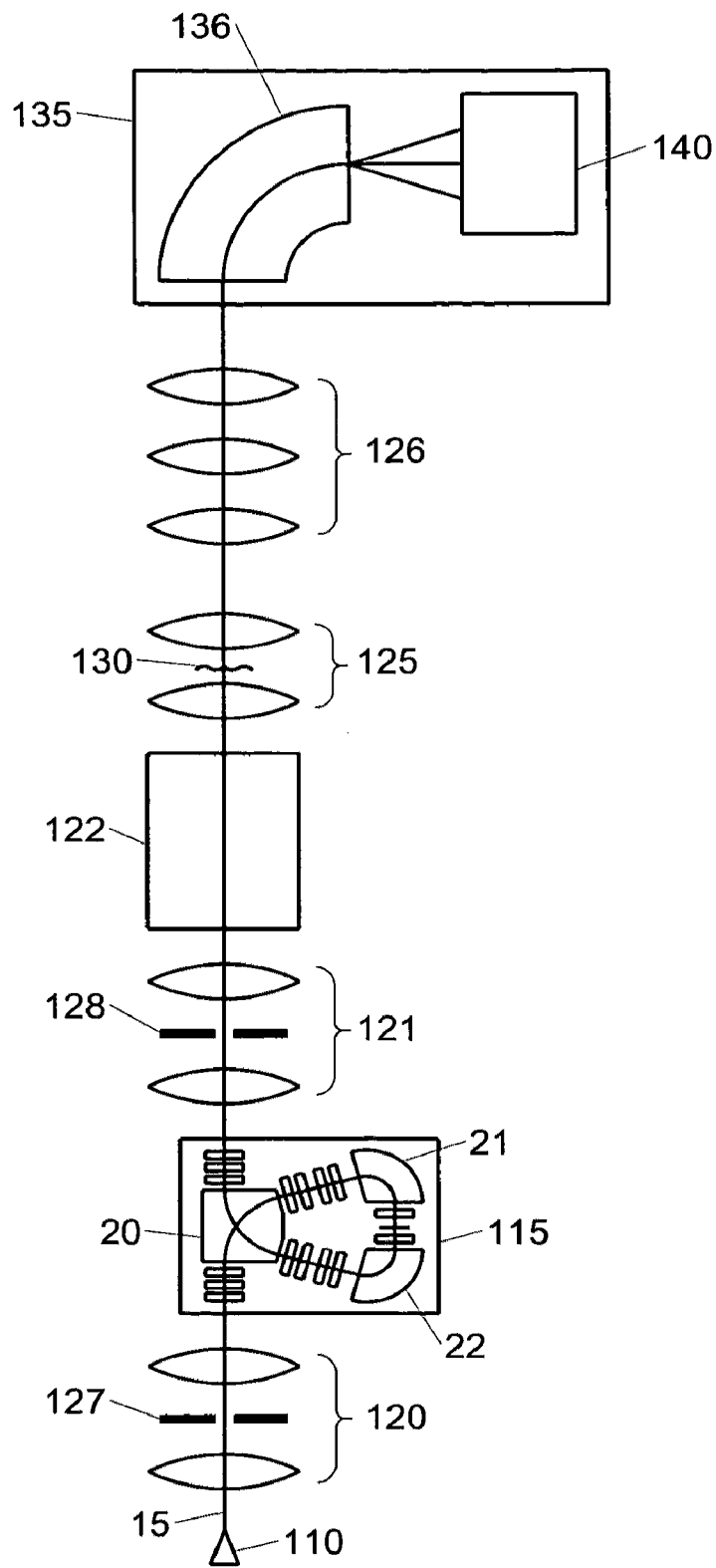
FIG. 5 is a schematic view of a complete apparatus utilizing the present invention, the apparatus comprising a source of electrons, part one condenser lenses, the energy-selecting apparatus, part two condenser lenses, an objective lens with a sample, several projectors, and various detectors including an electron energy-loss spectrometer.

FIG. 5 illustrates how the energy-selecting apparatus of the present invention can be integrated into a complete STEM column. Electron beam 15 emerging from electron source 110 enters a first assembly of condenser lenses 120 optionally comprising an angle-defining aperture 127, typically called the "virtual objective" or "condenser" aperture. It then enters energy-selecting apparatus 115 whose construction and operating principles have been illustrated in FIGS. 1-4. It then enters a second assembly of condenser lenses 121, optionally comprising an angle-defining aperture 128, enters an optional aberration corrector 122 in which aberrations of the system not corrected in the energy-selecting apparatus are set to zero, and then enters objective lens 125 and is focused on sample 130. The preferred embodiment of the objective lens is a condenser-objective lens, in which the sample is situated near the middle of the lens, and which is best shown schematically as two separate lenses, one just before and one just after sample 130. The beam then traverses a projector lens assembly 126, followed by various detectors that typically comprise an energy loss spectrometer 135 that includes an electron prism or prisms 136 and an electron detector 140.

When situated in a complete STEM column, the energy-selecting apparatus of the present invention can perform several functions besides energy-selecting the beam incident on sample 130. Specifically, it can correct aberrations arising in the rest of the probe-forming optical system, introduced anywhere between electron source 110 and sample 130. Especially significant is the correction of chromatic aberration of the probe-forming optical system, since this can be performed, inside the energy-selecting apparatus, by using sextupole lenses, thus avoiding the use of electrostatic optical elements that is a common feature of normal correctors of chromatic aberration. Additionally, second, third and higher-order geometric aberrations can also be controlled by multipole elements situated inside the energy-selecting apparatus. The energy-selecting apparatus can also stabilize the energy of the electron beam sent into the probe-forming optical system from source 110, by the simple expedient of separately monitoring the electron intensity falling on the two halves of the energy-selecting slit, and using a feed-back loop that adjusts the electron energy as needed to keep the beam centered on the slit. Lastly, it can also help stabilize electron energy spectra formed by spectrometer 135, by the simple expedient of connecting the windings of all the prisms of the energy-selecting apparatus 115 and of the spectrometer 135 in series, if the prisms are magnetic, so that the same current passes through all of them, or connecting the prisms in parallel, if the prism are electrostatic, so that their electrodes are kept at the same potentials.

While the above description contains many specificities for the purpose of illustrating the invention, the reader should not construe these as limitations on the scope of the invention, but merely as exemplifications of the preferred embodiment thereof. Other configurations and embodiments may be employed without substantially affecting the apparatus and methods of the invention. For example, multipoles 30, 31, 32, 40, 41, 42, 43 and 50, plus their mirror-related twin multipoles, could be separated into separate elements, e.g. quadrupoles and sextupoles situated one after the other, and various multipole components of said multipoles left out altogether, which would only alter the details of higher-order focusing, but not change the substance of the invention. Similarly, various multipoles could be added for more complete higher-order focusing than third-order, e.g. dodecapole moments could be excited in 12-pole multipoles 40, 41, 42 or 43, or added as separate elements, for fifth-order focusing, or various combination aberrations excited by running multipoles separated spatially in combination. Multipoles 30, 31 and 32 could be omitted altogether or replaced by round lenses, which would provide adjustable first-order focusing. Multipoles 40, 41, 42, 43 and 50 could be similarly replaced by round lenses, preferably arranged in rotation-free combinations, and supplemented by sextupoles and higher-order multipoles to give adjustable second rank and higher order focusing. Prisms 20, 21, 22 and 25 could be either parallel-plate prisms in which the field is constant, or gradient prisms in which the field changes for different diameter trajectories.

In yet another example, the exact mirror symmetry about the slit plane could be broken, and the essential character of the invention retained by arranging the electron trajectories such that beam 19 emerging from the apparatus was made dispersion-free. Slit 55 could be either a fixed-width slit which cuts out electrons other than those passing through its opening of a given width, in which case the energy width of the energy-selected beam can be adjusted by changing the dispersion of the electron beam arriving at the slit, or the width of the slit can be adjustable, in which case the energy width of the energy-selected beam can be changed without changing the dispersion at the slit. As another example, the cancellation of the energy dispersion of electron beam 19 emerging from the apparatus of the present invention need not be exact, since an approximate cancellation of the dispersion can confer a large fraction of the benefits of a precise cancellation. As a final example, energy-selecting slit 55 could be omitted altogether, and the apparatus of the present invention used as a chromatic and other aberration corrector for an electron microscope, based on the principle that a pair of sextupoles acting on an energy-dispersed electron beam is able to adjust both the beam's chromatic aberration $C_{c1,0}$ and chromatic astigmatism $C_{c1,2}$.

What is claimed is:

1. An energy-selecting apparatus for decreasing an energy range of an electron beam incident on a sample, said apparatus comprising:
   (a) one or more energy-dispersing elements disposed in first half of said apparatus and producing an energy-dispersed electron beam;
   (b) one or more magnifying optical elements disposed in said first half of said apparatus, said optical elements magnifying energy dispersion of said energy-dispersed electron beam;
   (c) an energy-selecting slit disposed at or near mid-plane of said apparatus, said slit intercepting electrons of energies outside a central pass-band of energies and thus decreasing range of energies of said energy-dispersed electron beam;
   (d) one or more de-magnifying optical elements disposed after said energy-selecting slit in second half of said apparatus, said optical elements de-magnifying said energy dispersion of said energy-dispersed electron beam;
   (e) one or more energy-undispersing elements disposed in said second half of said apparatus, said energy-undispersing elements cancelling said energy dispersion of said electron beam;
   (f) optical elements disposed after said energy-undispersing elements in said second half of said apparatus, said optical elements focusing said electron beam onto a sample,
   whereby said range of energies of said electron beam is decreased by said energy-selecting slit, said energy dispersion is subsequently canceled, and said electron beam of decreased range of energies is focused into an electron probe on said sample.

2. The apparatus of claim 1 wherein said magnifying optical elements and said de-magnifying optical elements are quadrupoles.

3. The apparatus of claim 1 comprising multipoles disposed in front of said energy-selecting slit and excited in such manner that second-rank aberrations comprising $d^2x/dx'^2$ and $d^2x/dy'^2$ and optionally third and higher rank aberrations are cancelled at said energy-selecting slit.

4. The apparatus of claim 1 comprising multipoles disposed behind said energy-selecting slit and excited in such manner that aberrations comprising axial coma $C_{2,1}$ and 3-fold astigmatism $C_{2,3}$ and optionally third and higher order aberrations of said electron probe formed at said sample are cancelled.

5. The apparatus of claim 1 comprising sextupoles disposed in locations where said beam is dispersed in energy, said sextupoles excited in such manner that chromatic aberration $C_{c1,0}$ and chromatic astigmatism $C_{c1,2}$ of said electron probe formed at said sample are cancelled.

6. The apparatus of claim 1 in which said energy of said electron beam is stabilized by separately monitoring intensities of said energy-dispersed electron beam falling on two halves of said energy-selecting slit, and said intensities are used as inputs of a feed-back loop arrangement that keeps said beam centered on said slit.

7. The apparatus of claim 6 in which said feed-back loop arrangement adjusts energy of said beam emitted by an electron source.

8. The apparatus of claim 1 in which said energy-dispersing elements are magnetic prisms, said magnetic prisms have their windings connected in series, and are further connected in series with a winding of a magnetic prism of an electron spectrometer, whereby energy spectra formed by said spectrometer are stabilized in energy.

9. The apparatus of claim 1 in which said energy-dispersing elements are electrostatic prisms, and voltages applied to said electrostatic prisms are connected in parallel, and are further connected in parallel to an electrostatic prism of an electron spectrometer, whereby energy spectra formed by said spectrometer are stabilized in energy.

10. An electron beam apparatus comprising:
    (a) at least one energy-dispersing optical element which imparts an energy dispersion to an electron beam;
    (b) at least one energy-undispersing optical element disposed downstream from said energy-dispersing elements, said energy-undispersing element cancelling said energy dispersion of said electron beam;
    (c) sextupole lenses acting on said electron beam in at least two locations at which said beam is energy-dispersed and at which ratios of extents of said beam in X direction and in Y direction are different, with said sextupole lenses adjusted so that chromatic defocus $C_{c1,0}$ and chromatic astigmatism $C_{c1,2}$ of said beam focused into said electron probe on said sample is made negligibly small.

11. The apparatus of claim 10, wherein said sextupole lenses are electromagnetic sextupole lenses.

12. The apparatus of claim 10, wherein said sextupole lenses are electrostatic sextupole lenses.

13. A method of selecting a pass-band of electron energies that renders an electron beam narrower in its energy spread in an electron beam apparatus such as an electron microscope, said method comprising the steps of:
    (a) dispersing said electron beam in energy using energy-dispersing elements;
    (b) magnifying resultant energy dispersion of said electron beam using first-order magnifying elements disposed in front of an energy-selecting slit;
    (c) selecting a pass-band of electron energies within said energy-dispersed electron beam using said energy-selecting slit;
    (d) de-magnifying said energy dispersion using first-order focusing elements disposed after said energy-selecting slit;
    (e) un-dispersing said electron beam in energy using energy-undispersing elements;
    (f) focusing said electron beam on a sample,
    whereupon range of said energies of said electron beam focused on said sample is rendered more narrow.

14. The method of claim 13 wherein additional sextupole lenses are disposed between said energy-dispersing elements and said energy-undispersing elements and are excited to such strength that chromatic aberration $C_{c1,0}$ and chromatic astigmatism $C_{c1,2}$ of said electron beam focused into a probe incident on said sample become adjustable and can be cancelled.

15. The method of claim 13 wherein intensities of said energy-dispersed electron beam falling on two halves of said energy-dispersing slit are monitored and compared in a feedback loop arrangement that keeps said beam centered on said energy-selecting slit.

16. The method of claim 13 wherein said energy-dispersing elements are magnetic prisms and said prisms are connected in series with each other and are further connected in series with a magnetic prism of an electron spectrometer situated after said sample, whereby an energy spectrum produced by said spectrometer is stabilized in energy.

17. The method of claim 13 wherein said energy-dispersing elements are electrostatic prisms, said electrostatic prism are connected in parallel with each other and are further connected in parallel with an electrostatic prism of an electron spectrometer situated after said sample, whereby an energy spectrum produced by said spectrometer is stabilized in energy.

* * * * *